United States Patent [19]
Klinger

[11] 3,863,174
[45] Jan. 28, 1975

[54] FREQUENCY SYNTHESIZER HAVING PHASE-LOCKED LOOP INCLUDING SAMPLE AND HOLD CIRCUIT FREQUENCY CONVERTER

[75] Inventor: Roman Klinger, Neuenburg, Germany

[73] Assignee: International Standard Electric Corporation, New York, N.Y.

[22] Filed: Apr. 24, 1974

[21] Appl. No.: 463,475

[30] Foreign Application Priority Data

May 21, 1973 Germany............................ 2325741

[52] U.S. Cl............................ 331/2, 331/14, 331/25
[51] Int. Cl............................................... H03b 3/04
[58] Field of Search............... 331/2, 14, 18, 25, 30; 328/151

[56] References Cited

UNITED STATES PATENTS

| | | | |
|---|---|---|---|
| 3,401,353 | 9/1968 | Hughes | 331/18 X |
| 3,546,618 | 12/1970 | Menkes | 331/18 X |
| 3,588,731 | 6/1971 | Hoeffer et al. | 331/2 |

*Primary Examiner*—Siegfried H. Grimm
*Attorney, Agent, or Firm*—John T. O'Halloran; Menotti J. Lombardi, Jr.; Alfred C. Hill

[57] ABSTRACT

There is disclosed herein a frequency generator of a known phase locked loop type providing one or a plurality of output frequencies. The frequency generator incorporates a sample and hold circuit rather than a conventional mixer as employed in prior art frequency generators to convert the frequency of the controlled oscillator or oscillators to a frequency which after being divided by a given factor equals the reference frequency for the phase comparator of the phase locked loop.

3 Claims, 5 Drawing Figures

Fig.3

FREQUENCY SYNTHESIZER HAVING PHASE-LOCKED LOOP INCLUDING SAMPLE AND HOLD CIRCUIT FREQUENCY CONVERTER

BACKGROUND OF THE INVENTION

German Published Application 2,205,389 discloses a circuit arrangement for generating channel frequencies lying within at least one frequency range, using for each frequency range a voltage controlled oscillator whose frequency is converted into a lower frequency. This lower frequency is fed to an adjustable frequency divider which acts as a channel selector and whose output signal is compared in a phase comparator with a reference frequency obtained by dividing the frequency of a crystal oscillator. The reference frequency is chosen to be equal to the channel spacing. The output signal of the phase comparator is used to control the voltage controlled oscillator.

In this known circuit arrangement, the frequency conversion is effected by mixing. It requires, in addition to the above-mentioned crystal oscillator for each frequency range, a crystal oscillator or a variable frequency oscillator for all frequency ranges. If crystal oscillators are used, they must be changed over in case of a range change. In the circuit design, therefore, the tolerances of several crystal oscillators must be taken into account.

In addition, the mixer used in the known circuit arrangement for frequency conversion is not suitable for being produced using integrated circuit technology.

German Published Application 2,126,281 discloses a circuit arrangement for generating several frequencies in which the control voltage for the voltage controlled oscillator is generated by sampling. In that arrangement, the width of the sampling pulses must be approximately equal to half a cycle of the frequency of the voltage controlled oscillator.

SUMMARY OF THE INVENTION

It is an object of the present invention to provide an improved multichannel oscillator which needs no mixer for frequency conversion and in which at least parts of the frequency converting device can be made using integrated circuit technology.

A feature of the present invention is the provision of a circuit arrangement for generating a plurality of spaced channel frequencies lying within at least one frequency range comprising: a first voltage controlled oscillator; a frequency converter coupled to the output of the first voltage controlled oscillator; an adjustable frequency divider coupled to the output of the frequency converter, the adjustable frequency divider being also a channel selector; a crystal oscillator; a fixed frequency divider coupled to the output of the crystal oscillator, the output frequency of the fixed frequency divider being a reference frequency having a value equal to the channel spacing; a phase comparator coupled to the adjustable frequency divider and the fixed frequency divider to provide a control signal proportional to the frequency difference between the output frequencies of the adjustable frequency divider and the fixed frequency divider; and a first low pass filter to couple the control signal from the phase comparator to the first voltage controlled oscillator for frequency control thereof; the frequency converter including a sample and hold circuit coupled to the output of the first voltage controlled oscillator, a pulse generator coupled to the crystal oscillator to produce a sampling pulse for application to the sample and hold circuit to sample the output frequency of the first voltage controlled oscillator, and a low pass filter coupled to the output of the sample and hold circuit to couple the converted frequency to the adjustable frequency divider, the sampling pulse having a pulse width which is very small as compared to the period of the output frequency of the first voltage controlled oscillator.

According to this invention to convert the frequencies of the voltage controlled oscillators into the intermediate frequency range, use is made of the existing crystal oscillator, from which the reference frequency for the phase comparator is derived, so that only a single crystal oscillator will be necessary. Consequently, the accuracy of the output frequency of the multichannel oscillator is determined only by this single crystal oscillator. In case of a band change, only the frequency of the voltage controlled oscillator must be changed.

Compared with a mixer, the sampler permits the processing of higher input levels and it has almost no transmission loss. This considerably simplifies the intermediate frequency amplifier, which must provide the drive level necessary for the adjustable divider.

BRIEF DESCRIPTION OF THE DRAWING

Above-mentioned and other features and objects of this invention will become more apparent by reference to the following description taken in conjunction with the accompanying drawing, in which.

DESCRIPTION OF THE PREFERRED EMBODIMENT

The prior art and the invention will be explained, by way of example, for two frequency ranges each having several channel frequencies. The extension to more than two frequency ranges is well known in the art. For the invention, it will be described later.

First, a well known multichannel oscillator will be described with reference to FIGS. 1 and 2.

Figure 1:
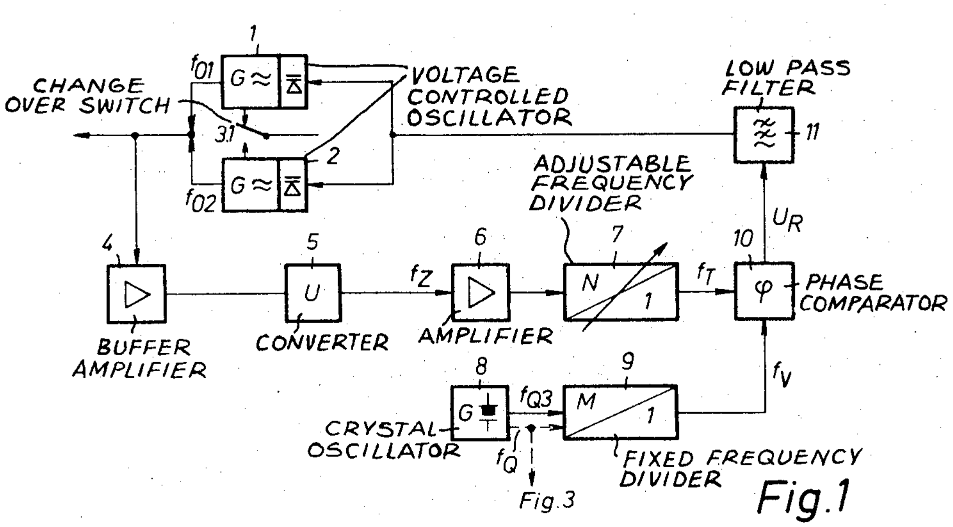
FIG. 1 is a block diagram of a known arrangement for generating channel frequencies and incorporating therein a modification to incorporate the frequency converter in accordance with the principles of the present invention.
Figure 2:
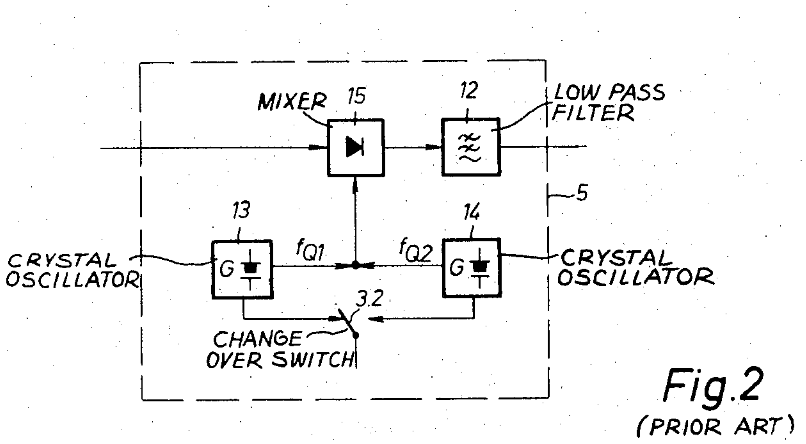
Fig.2 (PRIOR ART)
FIG. 2 is a block diagram of a known frequency converting device for the arrangement of FIG. 1 according to the known prior art.

Referring to FIG. 1, the reference numerals 1 and 2 designate two voltage controlled LC oscillators. With a changeover switch 3.1 oscillator 1 with the frequency $f_{01}$ or oscillator 2 with the frequency $f_{02}$ can be turned on. The frequency of the turned-on oscillator is applied through a buffer stage 4 to a converter 5, shown in more detail in FIG. 2. In this converter 5, the output signal of buffer stage 4 is applied to one input of a mixer 15 coupled to two crystal oscillators 13 and 14. With a changeover switch 3.2 crystal oscillator 13 with the frequency $f_{Q1}$ or crystal oscillator 14 with the frequency $f_{Q2}$ can be turned on. The two changeover switches 3.1 and 3.2 are so coupled together that with the turning-on of oscillator 1 or 2 the crystal oscillator 13 or 14 is turned on, too. The frequencies $f_{O1}$ and $f_{Q2}$ or $f_{O2}$ and $f_{Q2}$ are mixed in mixer 15. At the output of a following low pass filter 12 appears the intermediate frequency $f_Z = f_{O1} - f_{Q1}$ or $= f_{O2} - f_{Q2}$.

Via an amplifier 6 an adjustable frequency divider 7 is energized. It divides the intermediate frequency $f_Z$ by an integer $N$ and delivers at its output the divided frequency $f_T = f_Z/N$, which is fed to one input of a phase comparator 10.

A crystal oscillator 8 provides the frequency $f_{Q3}$, which is divided by an integer $M$ in a fixed frequency divider 9. The latter's output frequency $f_V = f_{Q3}/M$ is applied as the reference frequency to phase comparator 10.

Phase comparator 10 generates a control voltage $U_R$ whose value is dependent on the phase difference between the two input signals. The control voltage is applied through a low pass filter 11 to the reactance stages in oscillators 1 and 2.

The control action continues until the frequencies $f_T$ and $f_V$ agree without any locking-in error. The division ratios $N$ and $M$ are chosen so that the reference frequency $f_V$ is equal to the channel spacing.

A numerical example follows:

41 channel frequencies spaced at 25 KHz intervals are to be generated in two frequency ranges $$f_{O1} = 62 \ldots 63 \text{ MHz}$$

$$f_{O2} = 92 \ldots 93 \text{ MHz}$$

The frequencies $f_{Q1}$ and $f_{Q2}$ are chosen so that for the lowest frequencies of both frequency ranges the same intermediate frequency $f_Z$ is obtained.

$$f_{Q1} = 60 \text{ MHz}$$

$$f_{Q2} = 90 \text{ MHz}$$

$$f_Z = f_{O1} - f_{Q1} = f_{O2} - f_{Q2} = 2 \ldots 3 \text{ MHz}$$

$$f_V = f_{Q3}/M = 25 \text{ KHz}$$

At the end of the control action, $$f_T = f_V$$

Thus $$N = f_Z/f_T = (2 \ldots 3)10^6 \text{ Hz}/25 \cdot 10^3 \text{ Hz} = 80 \ldots 120$$

The channels are selected by varying the division ratio $N$ in units steps.

Figure 3:
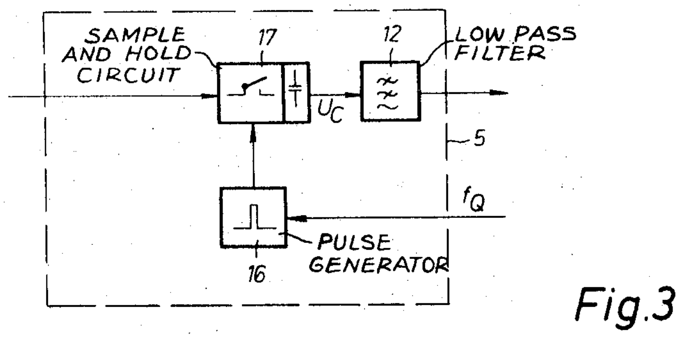
FIG. 3 is a block diagram of a novel frequency converting device for the arrangement of FIG. 1 in accordance with the principles of this invention.

The novel circuit arrangement will now be described with the aid of FIGS. 1 and 3, with the broken lines of FIG. 1 applying now. FIG. 3 shows a converter in which the signals of the voltage controlled oscillators 1 or 2 are sampled. From buffer stage 4 of FIG. 1 the signals are fed to a sample and hold circuit 17 including a sample portion and a hold portion. The sample portion is so controlled by a pulse stage 16 that, for the pulse duration, the input signal is applied to the hold portion. The pulse duration must be very short compared with the period of the oscillator frequencies $f_{O1}$ or $f_{O2}$. The pulse repetition frequency is determined by the crystal oscillator 8 (FIG. 1). The latter's frequency is now designated $f_Q$. In addition, the crystal frequency $f_Q$ is divided in divider 9 by the number $M$, which may also be a rational number. The divided frequency $f_V$ is again applied to phase comparator 10.

During frequency conversion, sample and hold circuit 17 acts like a mixer to which, up to a given ordinal number, all harmonics of $f_Q$ with equal amplitude are applied. Which harmonic becomes effective during the frequency conversion is determined by the cut off frequency of the following low pass filter 12 and by the range switched on. Across the hold portion appears the staircase voltage $V_E$ of FIG. 5, which low pass filter 12 turns into a continuous wave with the frequency $f_Z$. The intermediate frequency $f_Z$ is amplified in the amplifier 6 and divided by $N$ in frequency divider 7. At the output of divider 7 is again obtained the frequency $f_T = f_Z/N$, which is fed to phase comparator 10.

As described with reference to FIG. 1, phase comparator 10 varies its output voltage $U_R$ until the latter has brought voltage controlled oscillator 1 or 2, via low pass filter 11, to a frequency which results in error-free agreement between $f_T$ and $f_V$.

The crystal oscillator frequency $f_Q$ is chosen to be equal to the difference between the two, e.g. lowest, oscillator band frequencies, i.e., $$f_Q = f_{O1\ min} - f_{O2\ min}$$

Furthermore, $f_V = Q/M$, with $M$ chosen so that $F_V$ is equal to the channel spacing.

$$f_T = f_Z/N,$$

and in the regulated condition, $$f_T = f_V$$

Thus, $$f_Z = f_Q \cdot N/M$$

The channel frequencies, the frequency of the crystal oscillator, and the intermediate frequency are related by the following equations:

$$f_{O1} = af_Q + f_Z = (a + N/M)\, f_Q$$

$$f_{O2} = bf_Q + f_Z = (b + N/M)\, f_Q,$$

where $a$ and $b$ are the ordinal numbers of the harmonics of $f_Q$, i.e., integers.

In the following, the novel multichannel oscillator will be calculated with the same numerical values as in FIG. 1 above:

$$f_Q = f_{O2\ min} - f_{O1\ min}$$
$$= 92 \text{ MHz} - 62 \text{ MHz}$$
$$= 30 \text{ MHz}.$$

From $$f_V = f_Q/M = 25 \text{ KHz}$$

it follows that $M = 1200$.

From $$f_Z = f_Q \cdot N/M = f_{O1} - af_Q = f_{O1} - bf_Q$$

it follows for the lower range that $$a + N/M = f_{O1}/f_Q = (62 \ldots 63) \text{ MHz}/30 \text{ MHz}$$
$$= (2 + 2/30) \ldots (2 + 3/30),$$

and for the upper range, $$b + N/M = f_{O2}/f_Q = (92 \ldots 93) \text{ MHz}/30 \text{ MHz} = (3 + 2/30) \ldots (3 + 3/30).$$

Substituting $a = 2$ and $b = 3$ gives in both cases:

$$N = 80 \ldots 120.$$

Thus, the channels are also selectable by varying the division ratio $N$ in units steps.

The operation of the sample and hold circuit 17 will now be described with reference to FIGS. 4 and 5, use being made of the aforementioned numerical values.

Figure 4:
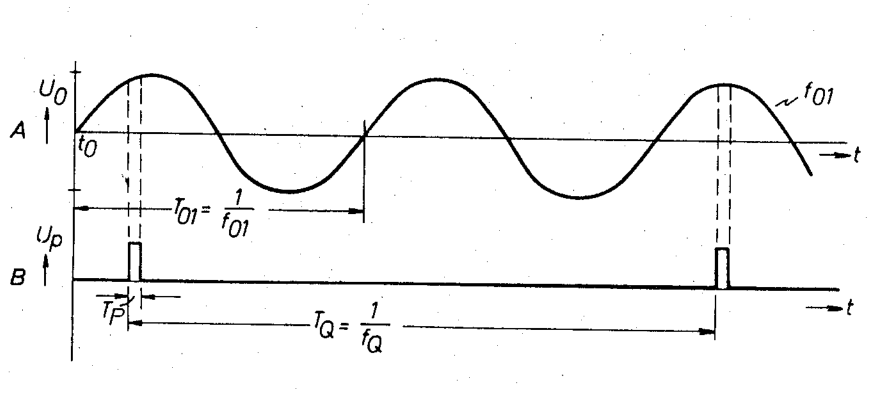
FIG. 4 is a diagram useful in explaining the operation of FIG. 3.

Curve A of FIG. 4 represents the oscillation $f_{O1}$ of voltage controlled oscillator 1. This oscillation is applied through buffer amplifier 4 to the sample portion. The period of the oscillation $f_{O1}$ is $T_{O1} = 1/f_{O1}$. The output signal of pulse stage 16 is shown in Curve B of FIG. 4. The pulse repetition frequency is equal to the frequency $f_Q$ of crystal oscillator 8. Thus, the time distance is $T_Q = 1/f_Q$. The pulse width $T_P$ is very small compared with the period $T_{O1}$ of the frequency $f_Q$. During the time $T_P$ the sampling switch is closed, and the instantaneous value of the applied oscillator voltage $U_O$ is stored in the capacitor without any leakage of charge until the next sampling operation takes place. The voltage waveform across the capacitor is shown in FIG. 5.

Figure 5:
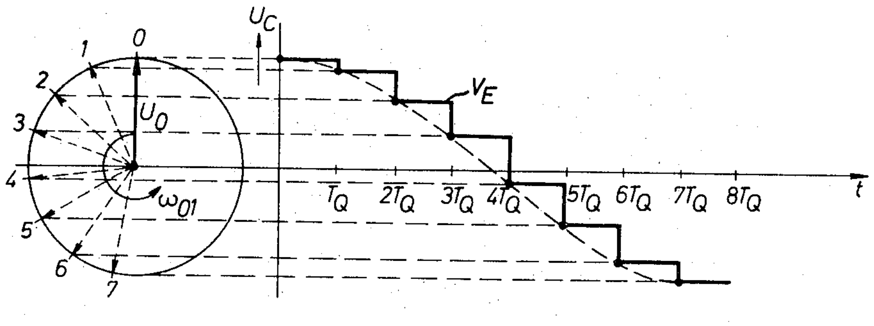
FIG. 5 illustrates the staircase voltage obtained by the circuit of FIG. 3.

FIG. 5 shows the oscillator voltage $U_O$ as a pointer rotating at the angular velocity $\omega_{O1} = 2\,\pi \cdot f_{O1}$. If the first sampling takes place at the pointer position shown, i.e. at the instant $t = 0$, the full voltage $U_O$ will be stored in the capacitor, i.e., $U_C = U_O$.

The next sampling takes place after the time $T_Q$. Meanwhile the pointer has covered an angular distance of $$\alpha = \omega_{O1} \cdot T_Q = 2\,\pi \cdot f_{O1}/f_Q.$$

For the lowest frequency of the lower range, $$\alpha = 2\,\pi \cdot 62.10^6/30.10^6 = 2\,\pi \cdot (2 + 2/30) \text{ rad},$$

i.e., up to the next sampling operation, the pointer performs two full rotations $= 2 \cdot 2\,\pi$ plus 2/30 rotations $= 2/30 \cdot 360° = 24°$. Starting from this point, up to the next sampling operation the pointer again performs two rotations plus 24° or four rotations plus 48°, referenced to $t_O$. Because of the very short sampling time for the amplitude value as compared to the time for one rotation of the pointer, the sampler evaluates only the instantaneous value of the voltage $U_O$, given by the instantaneous angular value, independently of the complete pointer rotations performed between two sampling instants. The voltage values of the sampling operations therefore represent a cosine-shaped staircase waveform, with the angular value advancing in 24° steps.

The fundamental frequency contained in this oscillation is $$\omega_Z = \Delta\alpha/\Delta t.$$

Substituting $$\Delta\alpha = 24° = 2\pi \cdot 2/30 \text{ rad, and}$$

$$\Delta t = T_Q = 1/f_Q = 1/30 \cdot 10^{-6} \text{ sec}$$

gives $$\omega_z = 2\pi \cdot 2/30/1/30 \cdot 10^{+6} \text{ rad/sec} = 2\,\pi \cdot 2 \cdot 10^6 \text{ rad/sec}$$

$$f_Z = \omega z/2\pi = 2 \cdot 10^6 \text{ Hz.}$$

If the calculation is carried out again for the lowest frequency of the upper range $f_{O2} = 92$ MHz, the same value will be obtained for the intermediate frequency $f_Z$. The only difference is that, between two sampling instants, the pointer traverses the angle $\alpha = 2\pi(3 + 2/30)$ rad, i.e., performs three complete rotations plus 2/30 rotations. As mentioned hereinbefore, however, the complete rotations between two sampling instants are not recognized by the sampler. From this it follows that it is also possible to cover more than two ranges with the sampler if the range spacings are made equal.

While I have described above the principles of my invention in connection with specific apparatus it is to be clearly understood that this description is made only by way of example and not as a limitation to the scope of my invention as set forth in the objects thereof and in the accompanying claims.

I claim:

1. A circuit arrangement for generating a plurality of spaced channel frequencies lying within at least one frequency range comprising:

- a first voltage controlled oscillator;
- a frequency converter coupled to the output of said first voltage controlled oscillator;
- an adjustable frequency divider coupled to the output of said frequency converter; said adjustable frequency divider being also a channel selector;
- a crystal oscillator;
- a fixed frequency divider coupled to the output of said crystal oscillator, the output frequency of said fixed frequency divider being a reference frequency having a value equal to the channel spacing;
- a phase comparator coupled to said adjustable frequency divider and said fixed frequency divider to provide a control signal proportional to the frequency difference between the output frequencies of said adjustable frequency divider and said fixed frequency divider; and
- a first low pass filter to couple said control signal from said phase comparator to said first voltage controlled oscillator for frequency control thereof;
- said frequency converter including
  - a sample and hold circuit coupled to the output of said first voltage controlled oscillator,
  - a pulse generator coupled to said crystal oscillator to produce a sampling pulse for application to said sample and hold circuit to sample the output frequency of said first voltage controlled oscillator, and
  - a low pass filter coupled to the output of said sample and hold circuit to couple the converted frequency to said adjustable frequency divider,
  - said sampling pulse having a pulse width which is very small as compared to the period of the output frequency of said first voltage controlled oscillator.

2. A circuit arrangement according to claim 1, further including

- a second voltage controlled oscillator capable of being switched into operation in place of said first voltage controlled oscillator so that said circuit arrangement can generate another plurality of spaced channel frequencies lying within a second frequency range different than said one frequency range.

3. A circuit arrangement according to claim 2, wherein

- said second frequency range and said one frequency range are spaced by a predetermined frequency, and
- said crystal oscillator generates a frequency equal to said predetermined frequency.

* * * * *